United States Patent
Carter et al.

(10) Patent No.: US 7,106,765 B2
(45) Date of Patent: Sep. 12, 2006

(54) TUNEABLE LASER

(75) Inventors: Andrew Carter, Blisworth (GB); Douglas Reid, Rugby (GB)

(73) Assignee: Bookham Technology, plc, Abingdon (GB)

( * ) Notice: Subject to any disclaimer, the term of this patent is extended or adjusted under 35 U.S.C. 154(b) by 215 days.

(21) Appl. No.: 10/492,992

(22) PCT Filed: Sep. 12, 2002

(86) PCT No.: PCT/GB02/04150

§ 371 (c)(1),
(2), (4) Date: Apr. 16, 2004

(87) PCT Pub. No.: WO03/034556

PCT Pub. Date: Apr. 24, 2003

(65) Prior Publication Data

US 2004/0247000 A1    Dec. 9, 2004

(30) Foreign Application Priority Data

Oct. 17, 2001 (GB) ................................. 0124919.2

(51) Int. Cl.
*H01S 3/10* (2006.01)
*H01S 5/00* (2006.01)
*H01S 3/08* (2006.01)

(52) U.S. Cl. .................. 372/20; 372/50.11; 372/96
(58) Field of Classification Search .................. 372/20, 372/50.11, 96
See application file for complete search history.

(56) References Cited

U.S. PATENT DOCUMENTS

| | | | |
|---|---|---|---|
| 4,847,856 A * | 7/1989 | Sugimura et al. ............. | 372/96 |
| 4,885,753 A | 12/1989 | Okai et al. | |
| 5,155,736 A * | 10/1992 | Ono et al. ..................... | 372/20 |
| 5,187,717 A * | 2/1993 | Horita et al. ................. | 372/96 |
| 5,325,382 A * | 6/1994 | Emura et al. ................. | 372/26 |
| 5,379,318 A | 1/1995 | Weber | |
| 5,642,371 A * | 6/1997 | Tohyama et al. ........ | 372/45.01 |
| 5,838,714 A | 11/1998 | Delorme | |
| 6,728,279 B1 * | 4/2004 | Sarlet et al. ............. | 372/43.01 |
| 6,826,206 B1 * | 11/2004 | Andersson .................... | 372/20 |
| 2004/0218638 A1 * | 11/2004 | Carter et al. .................. | 372/20 |

FOREIGN PATENT DOCUMENTS

| | | |
|---|---|---|
| EP | 0 559 192 B1 | 6/1999 |
| EP | 0 955 558 A2 | 11/1999 |
| GB | 2 304 423 A | 3/1997 |

* cited by examiner

OTHER PUBLICATIONS

Yuichi Tohmori et al.: "Broad-Range Wavelength-Tunable Superstructure Grating (SSG) DBR Lasers", IEEE Journal of Quantum Electronics, IEEE Inc. New York, US, vol. 29, No. 6, Jun. 1, 1993, pp. 1817-1823, XP000397619, ISSN: 0018-9197.

*Primary Examiner*—James Menefee
(74) *Attorney, Agent, or Firm*—Lahive & Cockfield, LLP; Anthony A. Laurentano, Esq.

(57) ABSTRACT

A tuneable laser includes a gain section bounded at one end by a first reflector adapted to produce a comb of reflective peaks and on the other end by a second reflector in the form of a plurality of discrete grating units each capable of reflecting at one of the peaks of the comb, and each grating unit having at least two independently actuable electrodes, which when actuated independently one from the other is capable of reducing the reflectivity of the grating unit and in which at least two of the grating units have different pitches.

22 Claims, 2 Drawing Sheets

TUNEABLE LASER

RELATED APPLICATIONS

This application is a 35 U.S.C. 371 national stage filing of International Application No. PCT/GB02/04150, filed 12 Sep. 2002, which claims priority to Great Britain Patent Application No. 0124919.2 filed on 17 Oct. 2001, in Great Britain. The contents of the aforementioned applications are hereby incorporated by reference.

This invention relates to tuneable lasers and has particular, but not necessarily exclusive, reference to tuneable lasers for use in telecommunications systems operating in the C-band, namely within the band of 1530 to 1570 nm.

BACKGROUND OF THE INVENTION

In this specification the term "light" will be used in the sense that it is used in optical systems to mean not just visible light but also electromagnetic radiation having a wavelength between 1000 nanometers (nm) and 3000 nm.

Single wavelength lasers are important for a number of applications in optical telecommunications and signal processing applications. These include multiple channel optical telecommunications networks using wavelength division multiplexing (WDM). Such networks can provide advanced features, such as wavelength routing, wavelength conversion, adding and dropping of channels and wavelength manipulation in much the same way as in time slot manipulation in time division multiplexed systems. Many of these systems operate in the C-band in the range 1530 to 1570 nm.

Tuneable lasers for use in such optical communications systems, particularly in connection with the WDM telecommunication systems, are known. A known tuneable system comprises stacks of single wavelength distributed Bragg reflectors (DBR) lasers, which can be individually selected, or tuned over a narrow range, or by a wide tuning range tuneable laser that can be electronically driven to provide the wavelength required. Limited tuning range tuneable lasers that rely upon thermal effects for tuning are also known.

U.S. Pat. No. 4,896,325 discloses a wavelength tuneable laser having sampled gratings at the front and rear of its gain region. The laser described in that specification relies on the use of two different gratings which produce slightly different reflection combs in the front and rear gratings. These provide feedback into the device. The gratings can be current tuned in wavelength with respect to each other. Co-incidence of a maximum from each of the front and rear gratings is referred to as a supermode. To switch the device between supermodes requires a small incremental electrical current into one of the gratings to cause a different pair of maxima to coincide in the manner of a vernier. By applying electrical currents to the two gratings so that the corresponding maxima track, continuous tuning within a supermode can be achieved.

In summary, for a given set of drive currents in the front and rear grating sections, there can only be a simultaneous correspondence in reflection peak at one wavelength, as a consequence of which the device lases at that wavelength. To change that wavelength a different current is applied to the front and rear gratings. Thus the front and rear gratings operate in a vernier mode, in which the wavelengths of correspondence determine a supermode wavelength.

An improved form of selective grating is the phase shifted grating, as described in UK-B-2 337 135, the contents of which are incorporated herein by way of reference.

The term "phase shifted grating" as used herein is used to describe and define a selectively reflecting distributed Bragg grating which is constructed and operates in the manner described and claimed in UK-B-2 337 135. In other words, a phase shifted grating is one in which the grating structure comprises a plurality of repeat gratings in which each grating unit comprises a series of adjacent diffraction gratings having the same pitch, and is characterised in that the grating units and adjacent gratings within a grating unit are separated by a phase shift of substantially pi ($\pi$) radians and in which at least two of the gratings within a grating unit have different lengths, the lengths being selected so as to provide a predetermined reflection spectrum.

Details on the construction and operation of the phase shifted grating are to be found in UK-B-2 337 135.

BRIEF SUMMARY OF THE INVENTION

By the present invention there is provided a tuneable laser including a gain section bounded at one end by a first reflector adapted to produce a comb of reflective peaks and on the other end by a second reflector in the form of a plurality of discrete grating units each capable of reflecting at one of the peaks of the comb, and each grating unit having at least two independently actuable electrodes, which when actuated independently one from the other is capable of reducing the reflectivity of the grating unit and in which at least two of the grating units have different pitches.

The first reflector may be a Bragg reflector and is preferably a phase shifted grating Bragg reflector.

A phase change section may be provided between the gain section and one or both of the reflectors. The phase change section may be located between the gain section and the first reflector only or between the gain section and the second reflector only.

The laser may emit light through the second reflector.

The second reflector may be such that the modification of the reflecting wavelength is affected by altering the refractive index of the material in which the grating units are formed.

Each of the grating units may be spatially separated from the adjacent grating unit. Also each grating unit may be provided with two electrodes which are adapted to be independently actuable from each other and the other electrodes in the second reflector.

The refractive index may be varied by passing an electrical current through the grating units.

The first reflector may also have an electrode to permit electrical current to be passed through it to alter the wavelengths at which the comb of reflecting peaks reflects.

The phase change section may have an electrode to permit the passage of electrical current through the phase change section to alter the refractive index of the material of the phase change section to affect the phase change.

The grating units of the second reflector may reflect at the peaks of the first reflector when there is no current passing through the electrodes associated with the grating units.

There may be a progressive or non-progressive change in pitch between the grating units of the gratings in the second reflector.

In a preferred embodiment, the discrete grating units in the second reflector are each kept short so that the cumulative waveguide length associated with the gratings is minimised, thereby minimising the waveguide losses. By short Bragg grating units as used herein is meant lengths such that the associated reflectivity of each grating unit is broad and there may be a degree of overlap between neighbouring grating unit reflectivities. However, the grating unit reflectivity discrimination is sufficient for stable lasing operation in combination with reduced light power losses when the front mirror is also a selective mirror.

In a preferred embodiment the first reflector is made long so that its comb reflection peaks are narrow and constitute well-defined wavelengths. "Long" as used in this context herein means as many repeat grating units as described in UK-B-2 337 135 as are required to produce sufficiently narrow peaks for single longitudinal mode operation of the laser. Preferably 10 or more repeat grating units are present.

The laser may have a tuning range comprising a central range band at which it is intended for use and an out-of-band range at one or both ends of the central range band so as to improve production yields and to allow for production tolerances.

DESCRIPTION OF THE PREFERRED EMBODIMENTS OF THE INVENTION

The wavelengths of interest referred to above, for example the C-band wavelengths of 1530 to 1570 nm, are the wavelengths of light in free space. When such light passes through a medium, of refractive index $n_{eff}$, the actual wavelength of the light within that medium, which will be referred to herein as λ', is the wavelength λ divided by the value for the refractive index $n_{eff}$. In other words:

$$\lambda' = \lambda/n_{eff}$$

where $n_{eff}$ is the effective refractive index of the medium as seen by the propagating light of wavelength λ in free space.

It so happens that the glass (silica) fibres, which are commonly used in telecommunications systems, have low loss regions at about 1100 nm 1300 nm and 1500 nm. These regions are about 100 nm wide and consequently much work is done on producing lasers that produce light in the low loss bandwidths. The same is true for the tuneable laser of the present invention. The specific examples of the invention are designed to work in the C-Band, but the invention could be used for other wavelengths if required and if new types of fibre optical cables become available.

Figure 1:
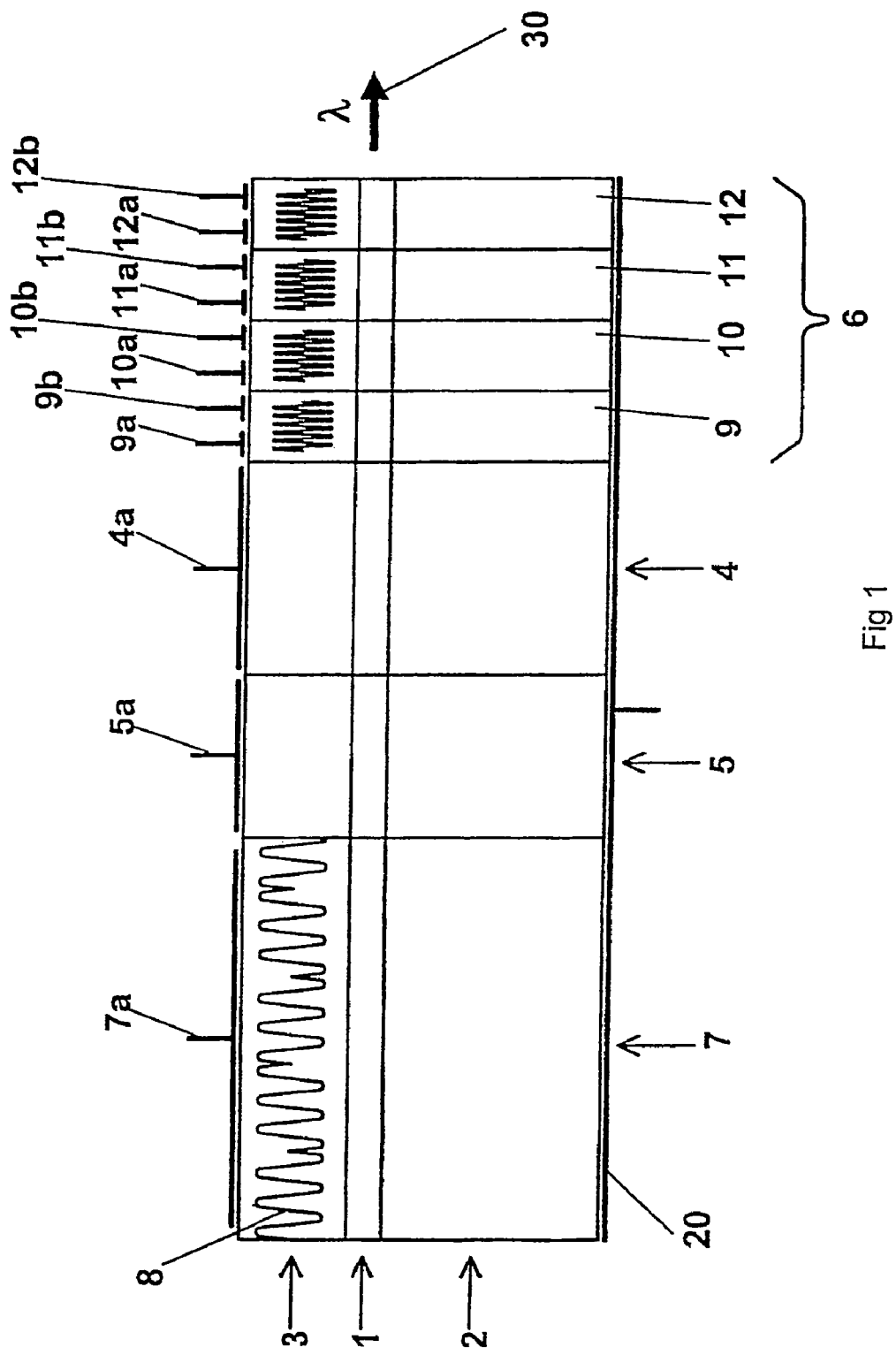
FIG. 1 is a schematic cross section through a laser in accordance with the invention.

Referring to FIG. 1, this shows a schematic cross sectional view of a laser in accordance with the present invention. As is conventional in semiconducting lasers the laser is built up in a series of layers, with a layer 1 formed between a lower layer 2 and an upper layer 3. Layer 1 bounded by layers 2 and 3 forms a waveguide. There may be a plurality of layers in the stricture, but they are not material to the invention and for the better understanding of the invention they are not shown.

The laser itself has four principal sections. A gain section 4, a phase change section 5 and front and rear reflecting sections 6 and 7. The rear reflecting section 7 has a phase shifted grating Bragg reflector 8 formed in the layer 3. Such a reflector produces a comb of reflectance peaks at separated wavelengths, and each peak is of substantially the same height. The front reflector 6 is made up of a series of different fixed pitch grating units, each grating unit being a distributed Bragg reflector, but each grating unit reflecting a range of wavelengths substantially centred on a defined wavelength only. The defined wavelengths of the individual peaks of the grating units 9 to 12 correspond to peaks of the comb of reflectance produced by the rear reflector. Using four grating units, 9 to 12 in the front reflector 6 is by way of example only, and alternative designs using greater or fewer grating units may be employed within the spirit of the invention.

The material of which layer 3 is formed in the sections corresponding to the reflectors 6 and 7 is such as to experience a reduction in refractive index when an electrical current is passed through it.

The invention design may be suitably applied to solid-state lasers manufactured using Group III–V or other semiconductor materials.

If only just sufficient current is injected into the gain section to make it generate light, the laser will not lase because the intensity of the light at all wavelengths is below the lasing threshold.

To get the laser to lase predictably, it is necessary to have both a population inversion of charge carriers within the gain material and to get at least one, and preferably only one, wavelength to be above the lasing threshold. This is achieved by injecting sufficient current into the gain section 4 through electrode 4a to create the population inversion and by reflecting light of one wavelength between the front and back reflectors, so that this wavelength will become the preferred or enhanced wavelength and the laser will commence to lase at that wavelength with light being emitted in the direction of arrow 30.

This is carried out as follows.

In FIG. 1 each grating unit, such as grating unit 9 has two electrodes 9a and 9b located over it. The gain section 4 has an electrode 4a, the phase section 5 has an electrode 5a, the phase shifted grating Bragg reflector 8 has an electrode 7a and there is a common return or earth electrode 20.

In use, if no current is passed through any of the electrodes over the grating units then each grating unit will reflect a range of wavelengths substantially centred on a defined wavelength for that grating unit. When the same current is applied to both the electrodes over a grating unit this has the effect of lowering the effective refractive index of the grating and therefore the Bragg wavelength of the grating. However by applying different currents to the electrodes on a grating unit or by only applying current to one of the electrodes on a grating unit the effective refractive index of only part of the grating unit will be changed due to limited current spreading in the grating layer. This has the effect of changing the effective refractive index of only part of the grating unit. This results conceptually in the formation of two reflection peaks which are close together in wavelength, instead of just one for the grating unit. In practice this results in a single broader peak of reduced intensity and centred on a slightly lower wavelength compared to the single narrower peak in the un-powered state.

If all of the grating units, except one, have one of their pairs of electrodes passing current and one not, then only the grating unit which has both electrodes in the same, preferably, un-powered state will have a peak higher than the others. This peak will coincide with one of the peaks of the phase shifted Bragg grating rear or first reflector, and thus the laser will be able to selectively lase at that wavelength.

This is explained in more detail with reference to FIGS. 2a to 2d. In the drawings the intensity of reflectance I is plotted vertically against wavelength λ.

Figure 2B:
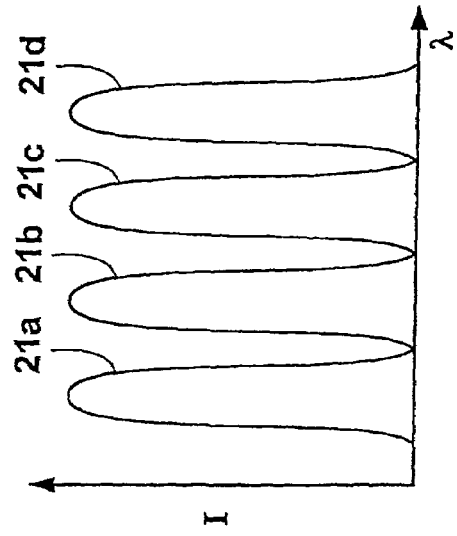
FIGS. 2a to 2d are graphs of intensity I vs. wavelength λ.
Figure 2A:
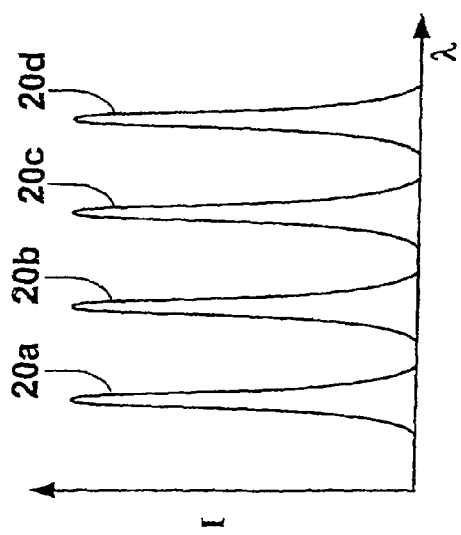
Figure 2D:
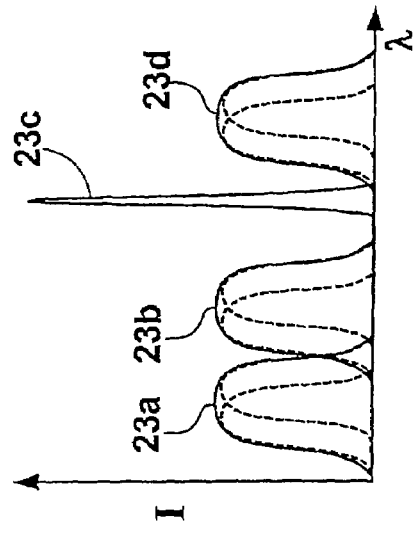

In FIG. 2a the peaks 20a to 20d correspond to narrow peaks of the phase shifted Bragg grating reflector 8. The peaks 21a to 21d in FIG. 2b correspond to the broader peaks of the grating units 9 to 12 when there is no current passing through the electrodes of the grating units.

Figure 2C:
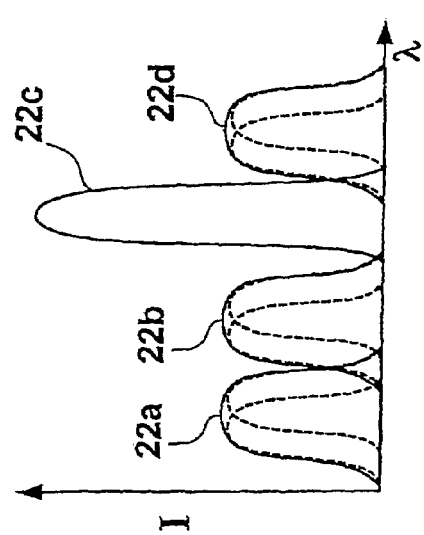

In the case of the arrangement shown in FIG. 2c, the current passing through electrodes 9a, 10a, and 12a is different to that passing through electrodes 9b, 10b and 12b. The peaks 21a, 21b, and 21d from FIG. 2b are therefore broadened and reduced in intensity as shown by peaks 22a, 22b, 22d in FIG. 2c. There is no current passing through electrodes 11a and 11b so that peak 22c is the same as peak 21c. Combining the reflectivity spectra as shown in FIGS. 2a and 2c gives the resultant spectra shown in FIG. 2d, where it can be seen that peak 23c is higher than the others and the laser will then lase at that wavelength. Thus the laser will be tuned to that wavelength. An advantage of this laser design is that the breadth of the front reflector peak can be sufficiently broad that tuning may be affected solely by the rear grating tuning current, within the wavelength window defined by the broad front reflector peaks.

If a current is now passed through electrode 7a this will effectively move the whole comb of peaks 20a to 20d, in FIG. 2a, to lower wavelengths. This is a result of the effective refractive index of the material, from which the phase shifted Bragg grating reflector is fabricated, being reduced. The peak 20c will still be within the envelope of peak 22c, although because the maxima of the peaks of the front and rear reflectors are no longer exactly aligned, the intensity of the new peak thus formed will be slightly less than the intensity of peak 23c.

If at the same time, a current is passed through electrodes 11a and 11b, then the peak 22c in FIG. 2c will also move to a lower wavelength and thus the maxima of the peaks of the front and rear reflectors can be brought back into exact alignment. Thus the laser can be fine tuned to lase at wavelengths not just between the peaks 21a and 21b of FIG. 2d by either of these two operations, but also to wavelengths lower than the peak 20a because that peak itself can be moved to lower wavelengths along with the peak 21a.

It will be appreciated that during fine tuning the differential currents passing through the electrode pairs 9a, 9b; 10a, 10b and 12a, 12b would not need to be altered.

To allow for production spread in operating characteristics and to assist in improving production yields, out of band, or edge-of-band, grating units can be employed. The out-of-band grating unit are then provided with tuning electrodes so that they can, by means of current injection, be driven to be the first in-band grating unit.

With InP, as a typical Group III–V laser material the reduction in material refractive index through current injection permits wavelength tuning in the range of 1–10 nm. Using such material, the tuning grating units will typically be designed with 8 nm wavelength spacing. With such an arrangement, to produce wavelength movements to the position of the boundary of the operating range of its next lowest wavelength neighbour requires typically 8 nm wavelength shift of the grating unit. By this means the whole band of interest may be covered.

The lasers as set out in the embodiments do not have a constant cavity length as they go from one supermode to another, which can result in mode hopping if great care is not taken to avoid it. The function of the phase change section 5 is to compensate for these variations in the optical path length as the laser is tuned. The section 5 is also formed of a material which will reduce in refractive index when a current is passed through it, and current can be passed through electrode 5a to effect such a change.

Thus the laser of the invention is capable of coarse tuning from one peak 20a to 20d as shown in FIG. 2a and also fine-tuning of the peaks to lower wavelengths in a simple and effective manner.

Although the above description refers to the use of a phase shifted grating Bragg reflector for the rear reflector, a sampled segmented grating distributed Bragg reflector could be used. A phase shifted grating Bragg reflector is preferred because the reflection peaks of the comb produced by such a distributed Bragg reflector is substantially flat and uniform. With a sampled segmented grating distributed Bragg reflector, as utilised in U.S. Pat. No. 4,896,325, on the other hand the reflection spectrum has a Sinc squared envelope, which means that the lasers with such an output distribution cannot be reliably operated over such a wide optical bandwidth as those using a phase grating distributed Bragg reflector as the rear mirror.

In normal operation light output is coupled from the front of the laser adjacent to the gain section, and a small amount of light maybe taken from the rear of the laser adjacent the Bragg grating(s) for auxiliary purposes such as wavelength locking. However, nothing is meant to imply that implementations with light primarily coupled out of the rear of the laser are precluded from the scope of the invention.

It is preferred that the reflectivity of the rear mirror be as high as possible, typically in the range 50% to 80%. On the other hand the reflectivity of the front mirror should be lower, and typically in the range 20% to 40%.

The invention claimed is:

1. A tuneable laser, comprising a gain section bounded at one end by a first reflector adapted to produce a comb of reflective peaks and at the other end by a second reflector in the form of a plurality of discrete grating units each capable of reflecting at one of the peaks of the comb, and each grating unit having at least two independently actuable electrodes, which when actuated independently one from the other are capable of reducing the reflectivity of the grating unit, and wherein each grating unit has a different pitch to that of each other grating unit, the laser being arranged such that it is tuned to a desired wavelength by applying current to both of the independently actuable electrodes of one selected grating unit only, and by applying current to all of the other grating units via only one of the at least two independently actuable electrodes of each of those grating units, such that the tuneable laser lases at the wavelength to which the selected grating unit is tuned.

2. The tuneable laser as claimed in claim 1, wherein the first reflector is a Bragg reflector.

3. The tuneable laser as claimed in claim 2, wherein the first reflector is a phase shifted grating Bragg reflector.

4. The tuneable laser as claimed in claim 1, further comprising a phase change section disposed between the gain section and at least one the first and second reflectors.

5. The tuneable laser as claimed in claim 4, wherein the phase change section is located between the gain section and the first reflector.

6. The tuneable laser as claimed in claim 1, wherein the laser emits light through the second reflector.

7. The tuneable laser as claimed in claim 1, wherein the second reflector is such that the modification of the reflecting wavelength is affected by altering the refractive index of the material in which the grating units are formed.

8. The tuneable laser as claimed in claim 7, wherein the refractive index is varied by passing an electrical current through one or more of the plurality of grating units.

9. The tuneable laser as claimed in claim 1, wherein the first reflector comprises an electrode to permit electrical current to be passed therethrough to alter the wavelengths at which the comb of reflecting peaks reflects.

10. The tuneable laser as claimed in claim 4, wherein the phase change section comprises an electrode to permit the passage of electrical current through the phase change section to alter the refractive index of the material of the phase change section to affect the phase change.

11. The tuneable laser as claimed in claim 1, wherein the plurality of grating units of the second reflector reflect at the peaks of the first reflector when there is no current passing through the electrodes associated with the t plurality of grating units.

12. The tuneable laser as claimed in claim 1, wherein the plurality of grating units of the second reflector reflect at the peaks of the first reflector when there is current passing through the electrodes associated with the plurality of grating units.

13. The tuneable laser as claimed in claim 1, wherein there is a progressive change in pitch between the plurality of grating units in the second reflector.

14. The tuneable laser as claimed in claim 1, wherein there is a non-progressive change in pitch between the plurality of gratings units in the second reflector.

15. The tuneable laser as claimed in claim 1, wherein the plurality of grating units in the second reflector are short.

16. The tuneable laser as claimed in claim 1, wherein the plurality of grating units are each spatially separated from an adjacent grating unit.

17. The tuneable laser as claimed in claim 1, wherein the first reflector is long.

18. The tuneable laser as claimed in claim 1, wherein the laser has a tuning range comprising a central range band at which it is intended for use and an out-of-band range at one or both ends of the central range band so as to improve production yields and to allow for production tolerances.

19. The tuneable laser according to claim 1, wherein substantially the same current is applied to both of the independently actuable electrodes of said one selected grating unit.

20. The tuneable laser according to claim 1, wherein each grating unit has a fixed pitch.

21. A tuneable laser, comprising a gain section bounded at one end by a first reflector adapted to produce a comb of reflective peaks and at the other end by a second reflector in the form of a plurality of discrete grating units each capable of reflecting at one of the peaks of the comb, and each grating unit having at least two independently actuable electrodes, which when actuated independently one from the other are capable of reducing the reflectivity of the grating unit, and wherein each grating unit has a different pitch to that of each other grating unit, the laser being arranged such that it is tuned to a desired wavelength by applying substantially the same current to both of the independently actuable electrodes of one selected grating unit only, and by applying different currents to the at least two independently actuable electrodes of each of the other grating units, such that the tuneable laser lases at the wavelength to which the selected grating unit is tuned.

22. The tuneable laser according to claim 21, wherein each grating unit has a fixed pitch.

* * * * *